(12) United States Patent
Kuo et al.

(10) Patent No.: US 6,917,053 B2
(45) Date of Patent: Jul. 12, 2005

(54) THIN FILM TRANSISTOR ARRAY SUBSTRATE AND PHOTOLITHOGRAPHY PROCESS AND DESIGN OF THE MASK THEREOF

(75) Inventors: Tai-Yu Kuo, Hsinchu (TW); Tung-Tsun Lin, Tainan (TW); Hsu-Ping Tseng, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/708,209

(22) Filed: Feb. 17, 2004

(65) Prior Publication Data

US 2005/0040399 A1 Feb. 24, 2005

(51) Int. Cl.$^7$ .................. H01L 29/04; H01L 31/036
(52) U.S. Cl. .................. 257/72; 257/57; 257/59
(58) Field of Search .................. 257/57, 59, 72, 257/347, 350–351

(56) References Cited

U.S. PATENT DOCUMENTS 6,087,648 A * 7/2000 Zhang et al. ............ 250/208.1

6,583,439 B2 * 6/2003 Yamazaki et al. ............ 257/59

* cited by examiner

Primary Examiner—Phat X. Cao
Assistant Examiner—Theresa T. Doan
(74) Attorney, Agent, or Firm—Jiang Chyun IP Office

(57) ABSTRACT

A thin film transistor array substrate, a photolithography process and a design of a mask thereof are provided. A photoresist layer is formed on a substrate, and a mask is set above the substrate. Then, the display element area of the mask is blocked in order to perform the exposure process to the photoresist layer. After that, the non-display element area of the mask is blocked in order to perform the exposure process to the photoresist layer. Finally, a development process is performed to pattern the photoresist layer. Wherein a plurality of pixel patterns is formed in the photoresist layer corresponding to the display element area, and a plurality of peripheral circuit patterns and a plurality of stitching pixel pattern are formed in the photoresist layer corresponding to the non-display element area. Moreover, each one of the stitching pixel patterns is connected to the corresponding pixel patterns.

7 Claims, 9 Drawing Sheets

THIN FILM TRANSISTOR ARRAY SUBSTRATE AND PHOTOLITHOGRAPHY PROCESS AND DESIGN OF THE MASK THEREOF

CROSS REFERENCE TO RELATED APPLICATIONS

This application claims the priority benefit of Taiwan application serial no. 92122605, filed Aug. 18, 2003.

BACKGROUND OF INVENTION

1. Field of the Invention

The present invention generally relates to a thin film transistor array substrate and a photolithography process and a design of the mask thereof. More particularly, the present invention relates to a thin film transistor array substrate and a photolithography process and a design of the mask thereof for reducing the exposure time and eliminate the trace generated by the junction of the exposure process.

2. Description of the Related Art

In general, a thin film transistor liquid crystal display (TFT-LCD) is constructed by a thin film transistor (TFT) array substrate and a color filter array substrate and a liquid crystal layer. The thin film transistor array substrate is constructed by a plurality of array aligned thin film transistors and a plurality of pixel electrodes, in which each of the thin film transistor is connected to a corresponding pixel electrodes. Each of the thin film transistors includes a gate, a channel layer, a drain and a source. The thin film transistor is generally used as a switch element of a liquid crystal display unit. The working principle of the thin film transistor is similar to that of a conventional metal oxide semiconductor (MOS) element having three terminals (a gate, a drain and a source).

A thin film transistor array substrate is generally manufactured by performing several photolithography and etching process steps. In other words, the thin film transistor array substrate is manufactured by performing the exposure processes for several times to transform the patterns of a mask to the photoresist layer of a substrate. Next, a development process is performed to pattern the photoresist layer. Then, another etching process is carried out to etch the film layer of the substrate using the patterned photoresist layer as an etching mask to form the desired pattern of the component.

In general, the apparatus used for the exposure process includes a substrate stage for holding the substrate, which is capable of performing a two-dimensional movement, and a mask stage for holding the mask having the predetermined pattern and mask stage is capable of providing a two-dimensional movement. When the exposure process is performed, the pattern of the mask is gradually transferred to the photoresist layer of the substrate by the projection optical system during each step of the movement of the mask stage and the corresponding movement of the substrate stage. The conventional exposure process is substantially classified into two types, namely, a one-time projection exposure process, that is, to transfer the whole pattern in the mask to the whole photoresist layer in one projection step. The other is the step-and-repeat projection exposure process (or so-called scanning type exposure process), that is, to transfer the pattern in the mask to a portion of the photoresist layer in one projection step, and repeat the step for several times to expose the whole photoresist layer. In recently years, in order to enlarge the display area of a liquid crystal display, the scanning type the exposure process is more commonly used in the manufacturing process of large-sized liquid crystal display.

In general, a conventional mask used in a scanning type exposure process of a thin film transistor array substrate is illustrated in FIG. 1. As shown in FIG. 1, the mask 100 includes the peripheral pattern area 110 having a left-sided pattern area and a right-sided pattern area and a central pattern area 120. The central pattern area 120 includes a plurality of pixel patterns 122, and a plurality of driving element bonding patterns 124 disposed in a portion of the edge of the central pattern area 120. In addition, the peripheral pattern area 110 includes a plurality of pixel patterns 112 and a plurality of peripheral circuit patterns 114. A portion of the edges of both sides of the peripheral pattern area 110 also includes a driving element bonding pattern 116. Thereafter, the patterns of the mask 100 are transferred to the photoresist layer of the substrate by moving the mask 100 and the substrate synchronously and performing one or a plurality of exposure processes to the areas. Then, these patterns are jointed with each other. Finally, the exposure process of the mask of the thin film transistor array substrate is completed.

FIG. 2 is a schematic drawing illustrating a conventional thin film transistor array substrate. As shown in FIG. 2, after the exposure process via the patterns of the left and right sides of the peripheral pattern area 110 of the mask 100, the patterns of the peripheral pattern area 110 are transferred to the photoresist layer (not shown) of the substrate 150. After a development process, an etching process is performed to etch the film layer using the patterned photoresist layer as an etching mask, and thus the peripheral element area 110a of the left and right sides of the substrate 150 is formed. Each of the left and right sided of the peripheral element area 110a includes a pixel structure 112a, a peripheral circuit 114a and a driving element bonding area 116a respectively. In addition, after performing a plurality of exposure processes to the central pattern area 120 of the mask 100, the pattern of the central pattern area 120 of the mask 100 is transferred to the photoresist layer of the substrate 150. Then, after performing a development process and an etching process using the patterned photoresist layer as an etching mask, central pattern areas 120a, 120b and 120c of the substrate 150 are formed in the film layer on the substrate 150. Wherein the central pattern areas 120a, 120b and 120c include pixel structures 122a and driving element bonding areas 124a respectively.

Referring to FIG. 1 and FIG. 2, the pixel structures 122a of the central pattern areas 120a, 120b and 120c, and the pixel structures 112a of the peripheral element area 110a are connected along the junction lines L1 to L4. Finally, a panel-display area 130 (the area surrounded by the dotted line in FIG. 2) is formed. Since the junction lines L1 to L4 is located in the panel-display area 130, a trace along the junction lines L1 to L4 may be generated due to the alignment errors of the mask 100 during the exposure processes.

Accordingly, in the above-described scanning type exposure process, the advantages are as following: an excellent imaging property can be maintained, and a large-scale exposure area can be achieved without using a large-sized expose device such as a mask and a stage. However, in the above-described scanning type exposure process, some junction lines in the panel-display area are formed during the exposure processes by using the central pattern area, and the other junction lines in the panel-display area are formed during the transferring of the left and right sided pattern areas of the peripheral element area and that of the central pattern areas. If some alignment errors occur during the alignment of the mask in the exposure process, some traces may be generated along the junction lines in the panel-display area, then the uniformity of the brightness of the whole panel may be reduced.

SUMMARY OF INVENTION

Accordingly, the purpose of the present invention is to provide a thin film transistor array substrate and the photolithography process and the design of the mask thereof, in order to solve the issue of the reduction of the uniformity of the brightness due to the alignment errors in the multi-exposure processes.

As embodied and broadly described herein, the present invention provides a design of a mask for a thin film transistor array substrate, wherein the mask has a display element area and a non-display element area. The mask is constructed by, for example but not limited to, a plurality of pixel patterns, a plurality of peripheral circuit patterns and a plurality of stitching pixel patterns. The pixel patterns are disposed in the display element area, the peripheral circuit patterns are disposed in the non-display element area, and the stitching pixel patterns are disposed in the non-display element area adjacent to the display element area.

In the design of the mask of the thin film transistor array substrate of the present invention, the non-display element area is disposed on both sides of the display element area, and a plurality of driving element bonding patterns, for example, can also be disposed at the edge of the display element area.

According to the above-described design of the mask for the thin film transistor array substrate, the present invention provides a photolithography process. First of all, a mask for the thin film transistor array substrate of the present invention is provided. Then, the mask is set above a substrate, wherein a photoresist layer is formed on the substrate. Then the display element area of the mask is blocked, and an exposure process to the photoresist layer by using the non-display element area is performed. Next, the non-display element area of the mask is blocked, and at least one or more exposure processes to the photoresist layer by using the display element area is performed. Finally, a development process is performed to pattern the photoresist layer. Thus a plurality of pixel patterns are formed in the photoresist layer corresponding to the display element area, and a plurality of peripheral circuit patterns and a plurality of stitching pixel patterns are formed in the photoresist layer corresponding to the non-display element area. Wherein each one of the stitching pixel patterns is connected with a corresponding pixel pattern.

Accordingly, after the above-described exposure process of the thin film transistor array substrate, and an etching process of the film layer of the substrate using the patterned photoresist layer as an etching mask are performed, the thin film transistor array substrate of the present invention can be formed. The thin film transistor array substrate of the present invention has a non-panel-display area and a panel-display area. The thin film transistor array substrate is constructed by, for example, a plurality of pixel structures, a plurality of peripheral circuits and a plurality of stitching pixel structures. The pixel structures are disposed in the panel-display area, and the peripheral circuits are disposed in the non-panel-display area. In addition, the stitching pixel structures are disposed in the non-panel-display area, and each of the stitching pixel structures and each of the pixel structures are correspondingly connected in the non-panel-display area.

In the thin film transistor array substrate of the present invention, the non-panel-display area is disposed at both sides of the panel-display area. In addition, the thin film transistor array substrate of the present invention also includes, for example, but not limited to, a plurality of driving element bonding areas, wherein the driving element bonding areas are disposed at the edges of the panel-display area.

Accordingly, in the design of the mask of the thin film transistor array substrate of the present invention, a plurality of stitching pixel patterns and a plurality of peripheral circuit patterns are disposed in the non-display element area but no driving element bonding area is disposed in the non-display element area, and a plurality of pixel patterns are disposed in the display element area. Moreover, by performing the exposure process of the thin film transistor array substrate of the present invention via a plurality of masks designed by the present invention, a plurality of exposure and development processes to the display element area and the non-display element area of the photoresist layer can be achieved. Finally, after the etching process of the film layer of the substrate using the patterned photoresist layer as an etching mask is performed, the thin film transistor array substrate of the present invention is achieved.

In another embodiment of the invention, a thin film transistor (TFT) array substrate having a non-panel-display area and a panel-display area is provided. The TFT array substrate includes, for example but not limited to, a plurality of pixel structures, first stitching pixel structures, peripheral circuits and second stitching pixel structures. The pixel structures and the first stitching pixel structures are disposed in the panel-display component, in which the stitching pixel structures are adjacent to the pixel structures. The peripheral circuits and the second stitching pixel structures are disposed in the non-panel-display area. In addition, the first stitching pixel structures of the panel-display component and the second stitching pixel structures of the non-panel-display area are connected in the non-panel-display area.

Accordingly, in the design of mask and the exposure process of the thin film transistor array substrate of the present invention, the stitching pixel pattern transferred from the non-display element area and the pixel pattern transferred from the display element area are aligned and connected. In other words, the connection area of the conventional pixel pattern is shifted to a portion outside the panel-display area of the thin film transistor array substrate, in order to reduce the generation of the trace during the connection of the exposure process. Moreover, in the design of the mask of the present invention, the non-display element area only includes the peripheral circuit patterns and the stitching pixel structure used for the connection of the exposure process. Therefore, the width occupied by of the non-display element area in the whole mask can be reduced, and the width occupied by the display element area in the whole mask can be increased relatively. Thus, when the exposure process of the thin film transistor array substrate of the present invention is provided, the time of each exposure process is advantageously reduced to achieve the same display element area of a thin film transistor array substrate in comparison with that of a prior art. Thus, the throughput of the exposure process is enhanced.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Hereinafter, the design of the mask of the thin film transistor array substrate of the present invention will be described, and an exemplary embodiment of one of the exposure process of the thin film transistor array substrate, and the achieved thin film transistor array substrate after the development and etching process of the present invention will be described in more details in accordance with the illustrated figures.

Figure 3:
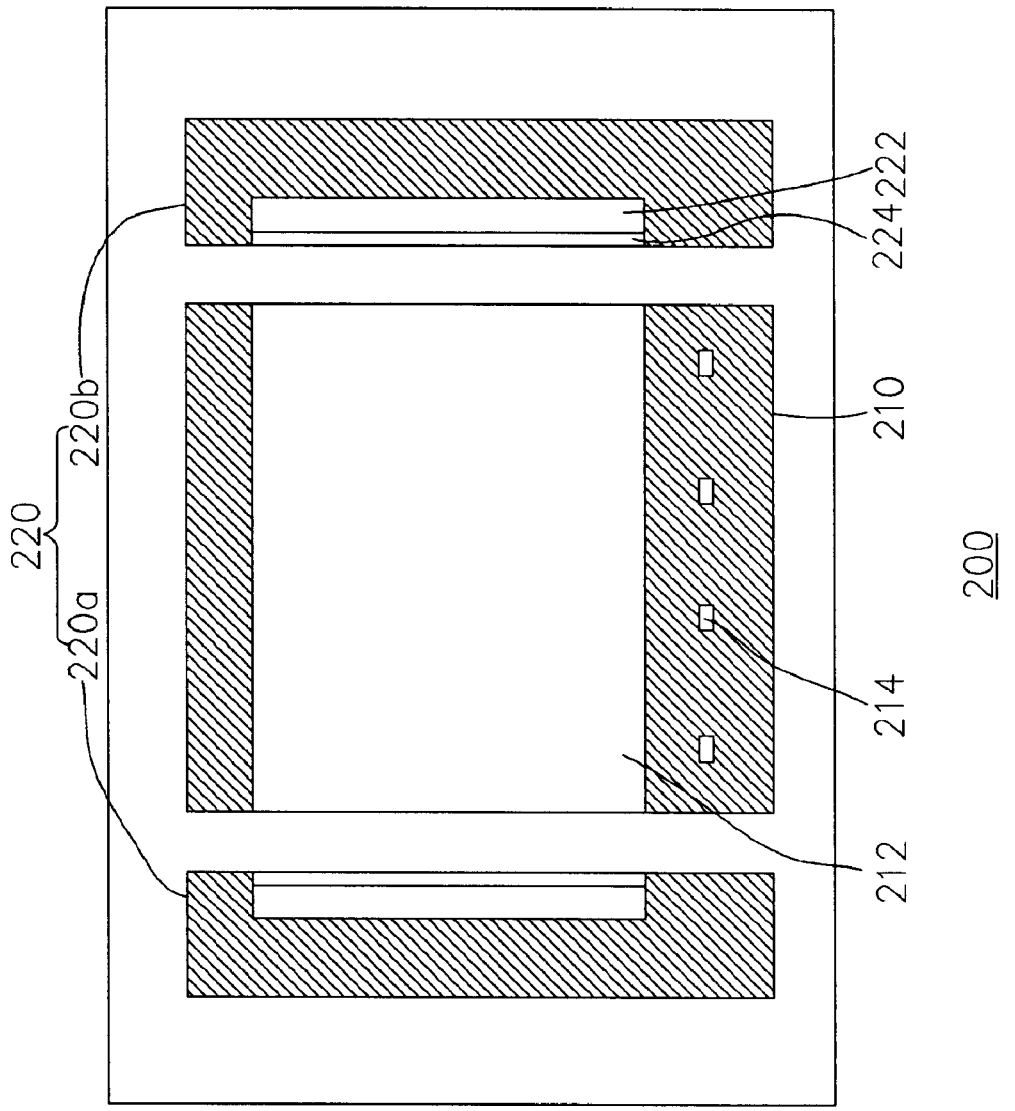
FIG. 3 is a schematic drawing illustrating a design of a mask for a thin film transistor array substrate according to an embodiment of the present invention.

FIG. 3 is a schematic drawing illustrating a design of a mask for a thin film transistor array substrate according to an embodiment of the present invention. Referring to FIG. 3, a mask 200 includes a display element area 210 in the middle part of the mask 200, and a non-display element area 220 in the both sides of the mask 200. The display element area 210 includes, for example, but not limited to, a pixel pattern 212 and a plurality of driving element bonding patterns 214. The non-display element area 220 includes, for example but not limited to, peripheral circuit patterns 222 and stitching pixel patterns 224, but no driving element bonding patterns. In addition, the non-display element area 220 may includes a left-sided non-display element area 220a and a right-sided non-display element area 220b.

Figure 4A:
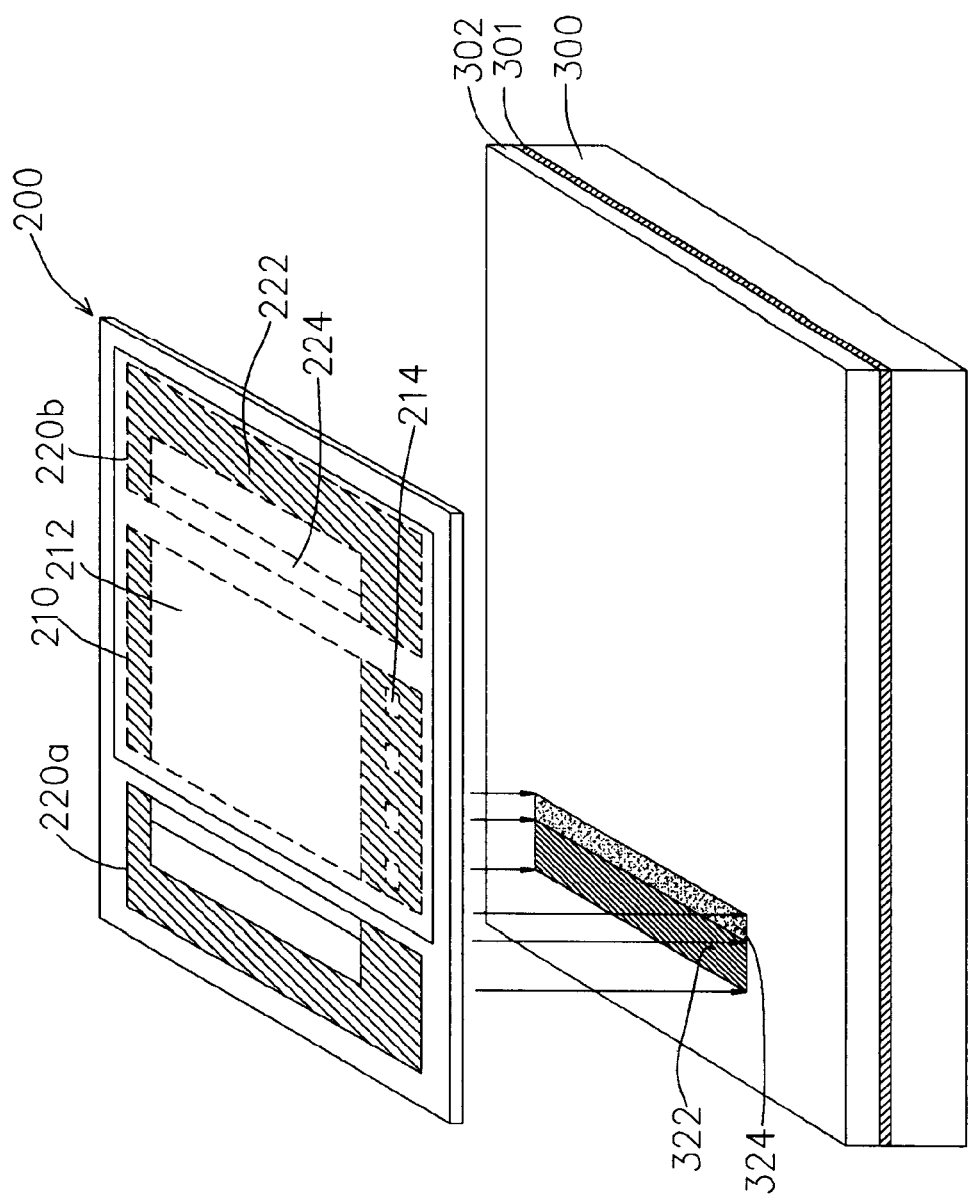
FIG. 4a to FIG. 4e are schematic drawings illustrating a photolithography process flow of the thin film transistor array substrate according to an embodiment of the present invention.

FIG. 4a to FIG. 4e are schematic drawings illustrating a photolithography process flow of the thin film transistor array substrate according to an embodiment of the present invention. Referring to FIG. 4a, first of all, the above-described mask 200 is set above a substrate 300, wherein a film layer 301 is formed on the substrate 300 and a photoresist layer 302 is formed on the film layer 301. Then the display element area 210 and the right-sided non-display element area 220b of the mask 200 are blocked, and an exposure process is performed over the photoresist layer 302 using the pattern of the left-sided non-display element area 220a. Therefore, the pattern of the left-sided non-display element area 220a of the mask 200 (including the peripheral circuit patterns 222 and the stitching pixel pattern 224) is transferred to the photoresist layer 302.

Figure 4B:
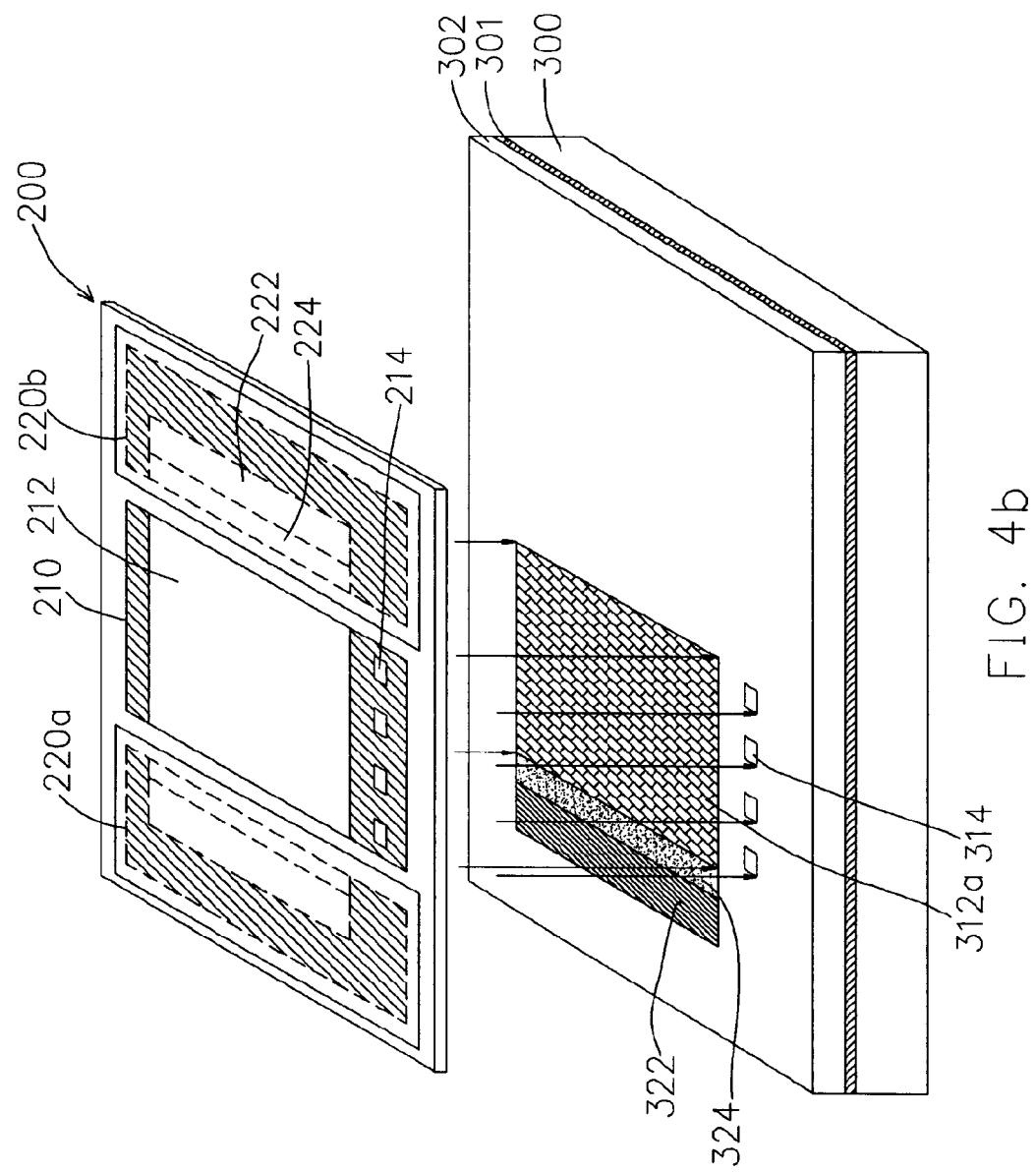

Referring to FIG. 4b, the left-sided non-display element area 220a and the right-sided non-display element area 220b of the mask 200 are blocked, and a first exposure process is performed over the photoresist layer 302 using the pattern of the display element area 210. Therefore, the pattern of the display element area 210 of the mask 200 (including the pixel pattern 212 and the driving element bonding patterns 214) is transferred to the photoresist layer 302. It is noted that, in the photoresist layer 302, the pixel pattern image 312a transferred from the display element area 210 of the mask 200 must be precisely connected and aligned with the stitching pixel pattern image 324 transferred from the left-sided non-display element area 220a of the mask 200.

Figure 4C:
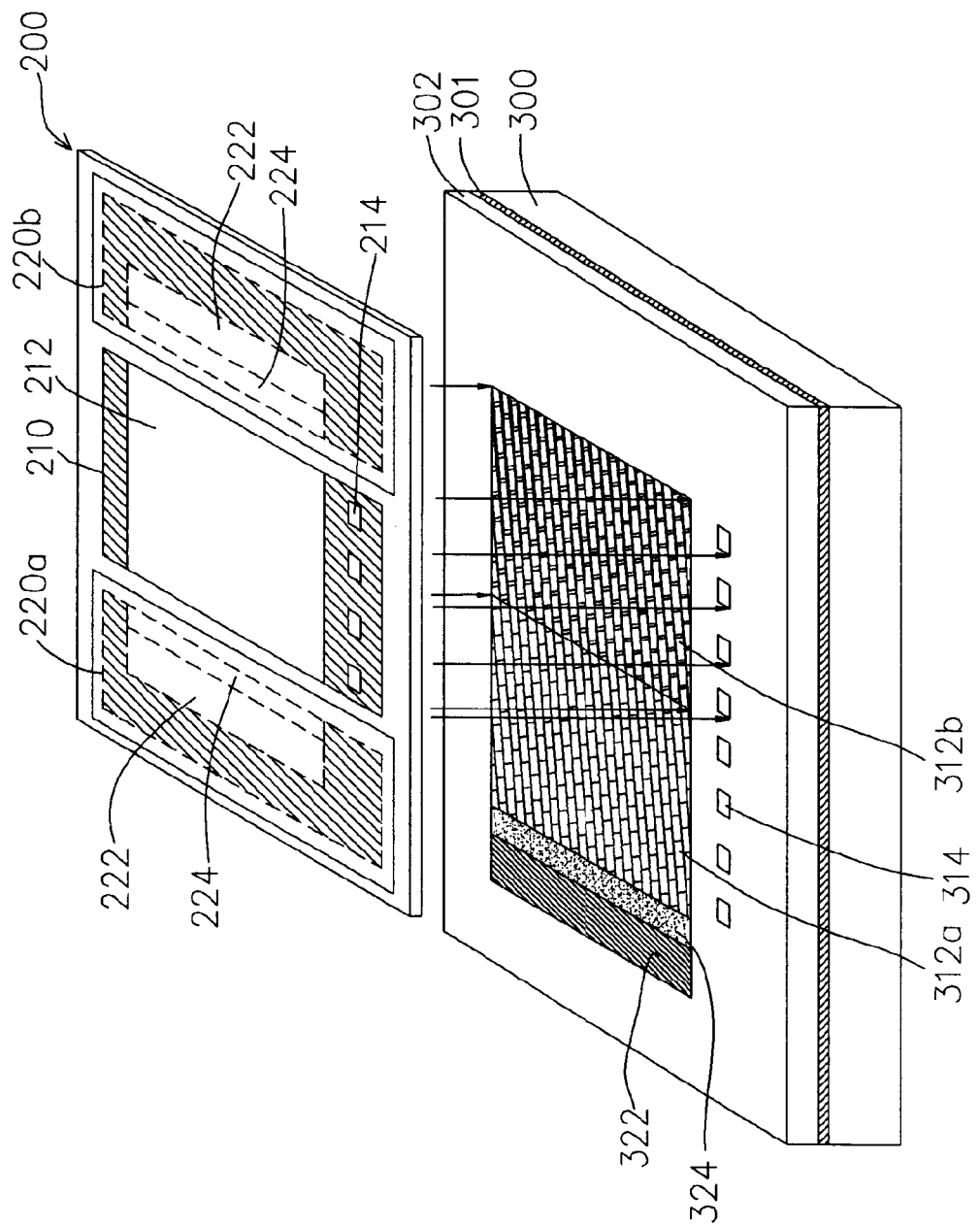

Referring to FIG. 4c, the left-sided non-display element area 220a and the right-sided non-display element area 220b of the mask 200 are blocked, the mask 200 is shifted to the left, and a second exposure process to the photoresist layer 302 is performed using the pattern of the display element area 210. Therefore, the pattern of the display element area 210 of the mask 200 (including the pixel pattern 212 and the driving element bonding patterns 214) is transferred to the photoresist layer 302. Moreover, in the photoresist layer 302, the pixel pattern image 312a transferred from the display element area 210 of the first exposure process must be precisely connected and aligned with the pixel pattern image 312b transferred from the display element area 210 of the first exposure process.

Figure 4D:
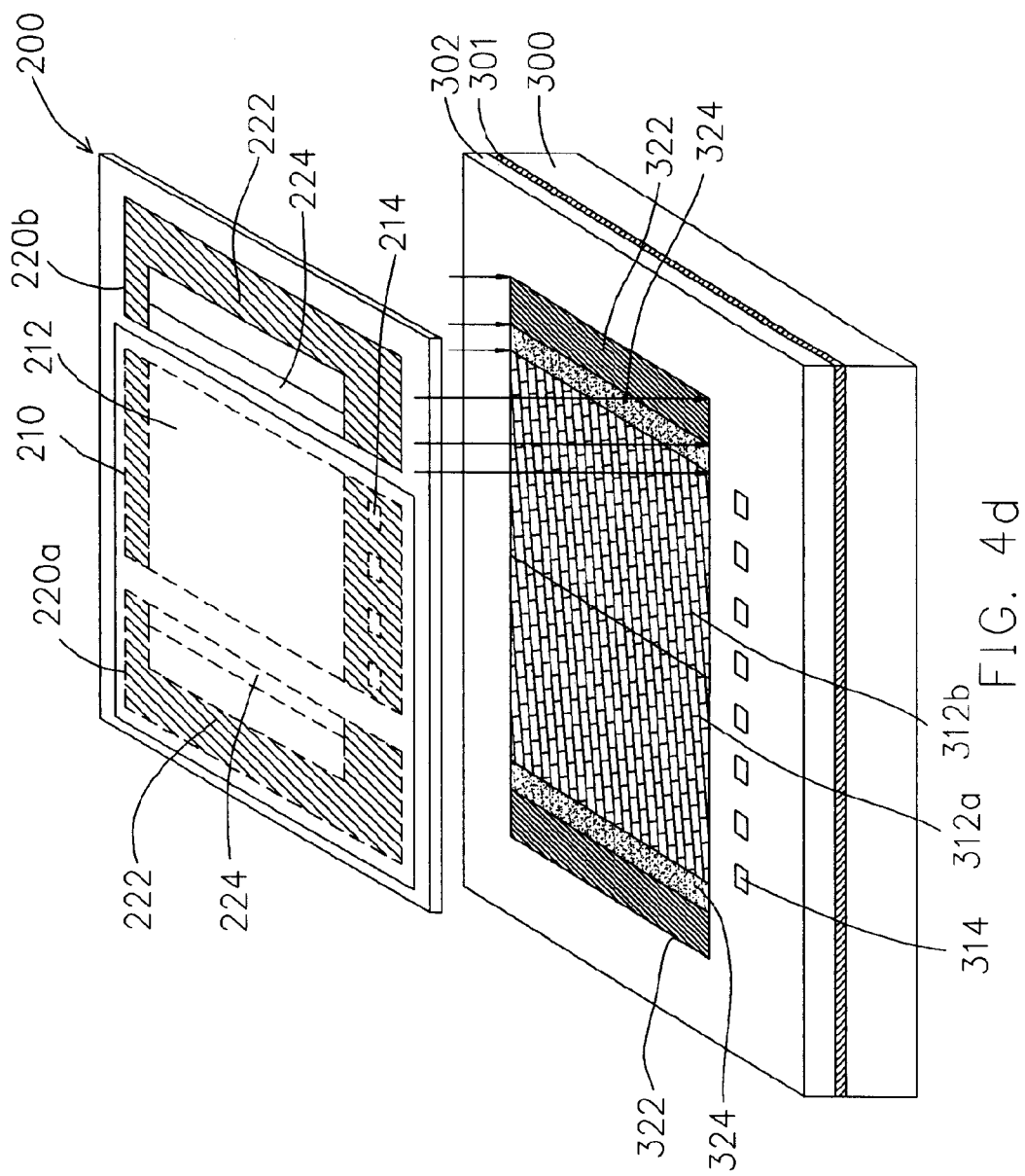

Referring to FIG. 4d, the left-sided non-display element area 220a and the display element area 210 of the mask 200 are blocked, and an exposure process to the photoresist layer 302 is performed by using the pattern of the right-sided non-display element area 220b. Therefore, the pattern of the right-sided non-display element area 220b of the mask 200 (including the peripheral circuit patterns 222 and the stitching pixel pattern 224) is transferred to the photoresist layer 302. Moreover, in the photoresist layer 302, the pixel pattern image 312b transferred from the display element area 210 of the mask 200 must be precisely connected and aligned with the stitching pixel pattern image 324 transferred from the right-sided non-display element area 220b of the mask 200.

Figure 4E:
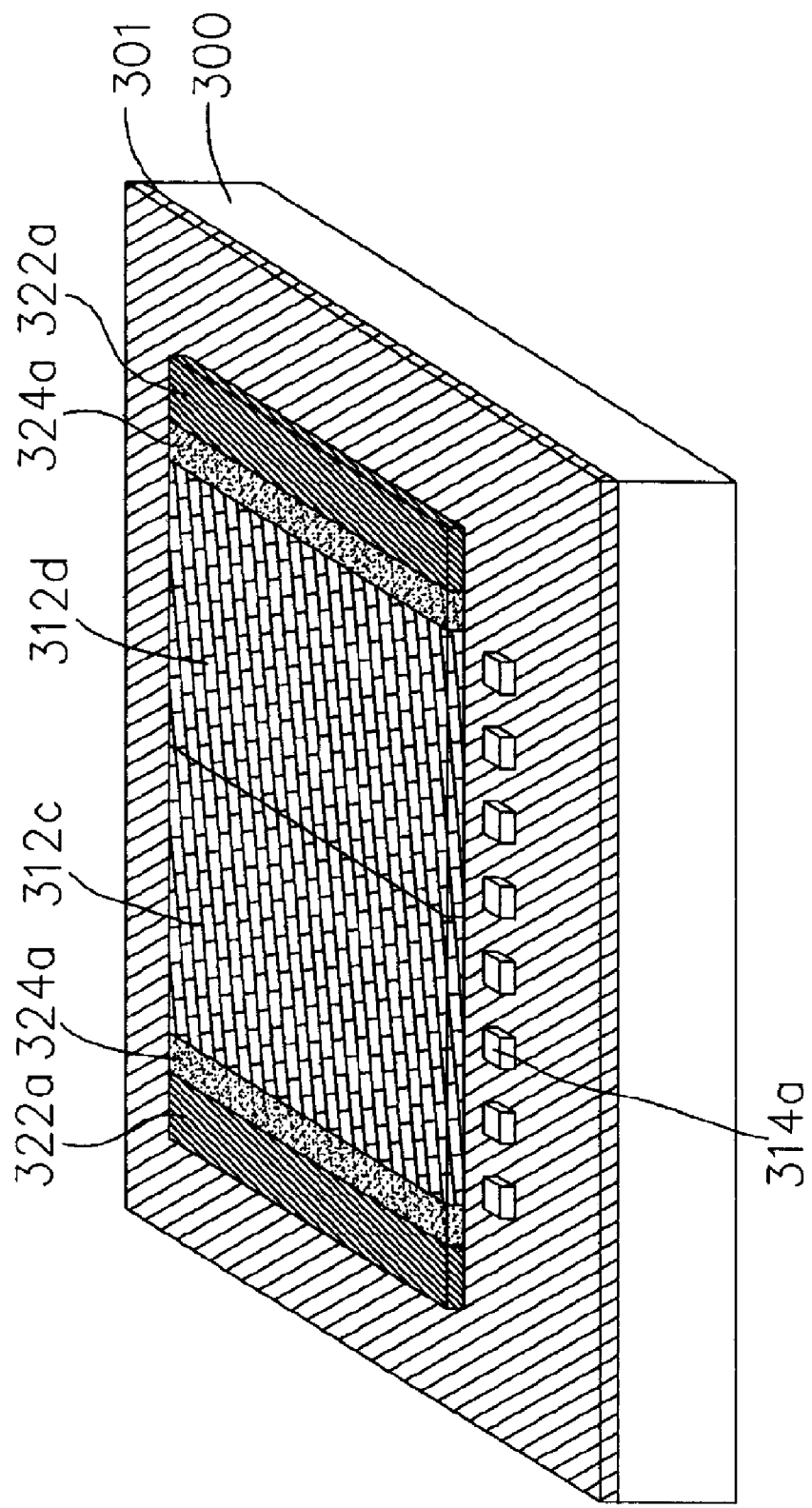

Referring to FIG. 4e, a development process is performed to pattern the photoresist layer 302. Finally, peripheral circuit patterns 322a, stitching pixel patterns 324a, pixel patterns 312c, 312d and driving element bonding patterns 314a are formed, in which the stitching pixel patterns 324a are connected with the pixel patterns 312c and 312d.

In the above-described embodiment, by using the patterned photoresist layer as an etching mask, an etching process is performed to etch the film layer 301 of the substrate 300 to form the thin film transistor array substrate of the present invention.

Figure 1:
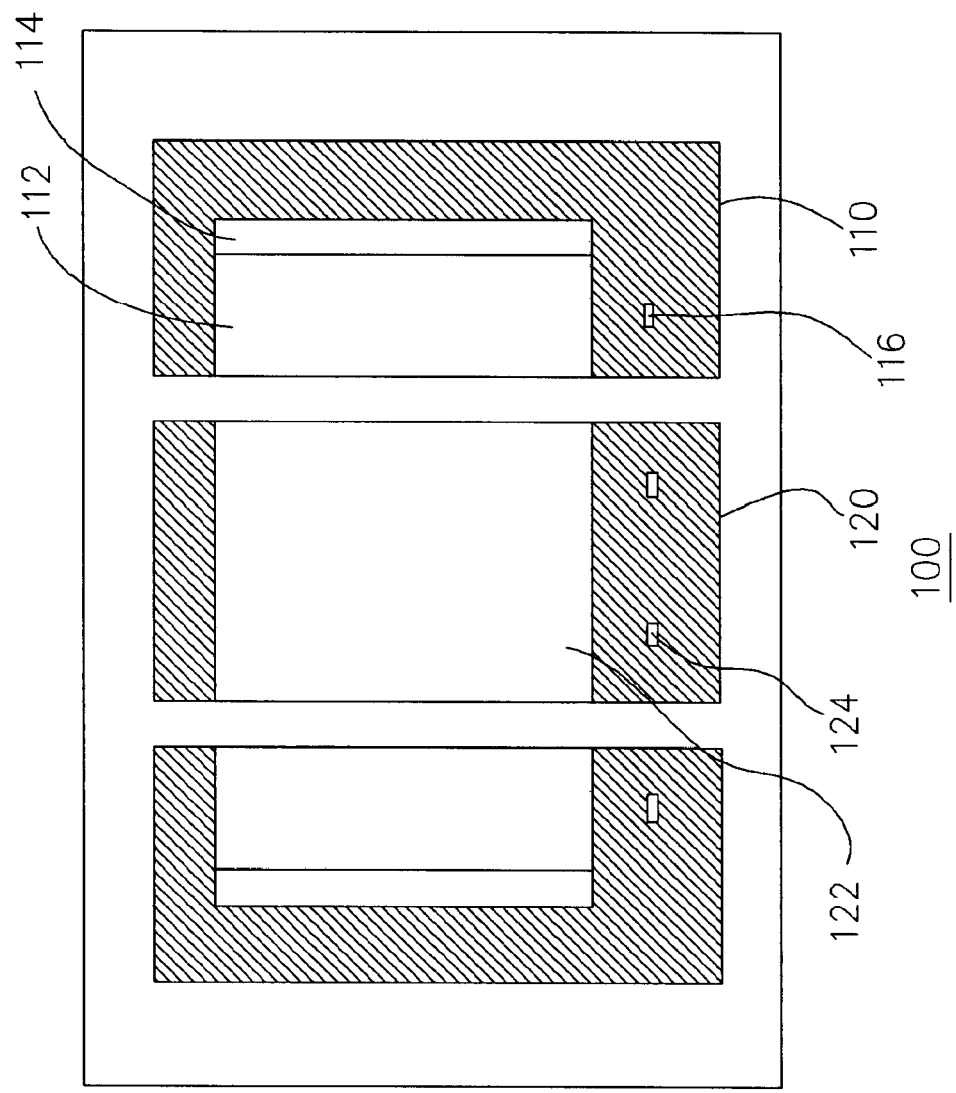
FIG. 1 is a schematic drawing illustrating a conventional mask.
Figure 2:
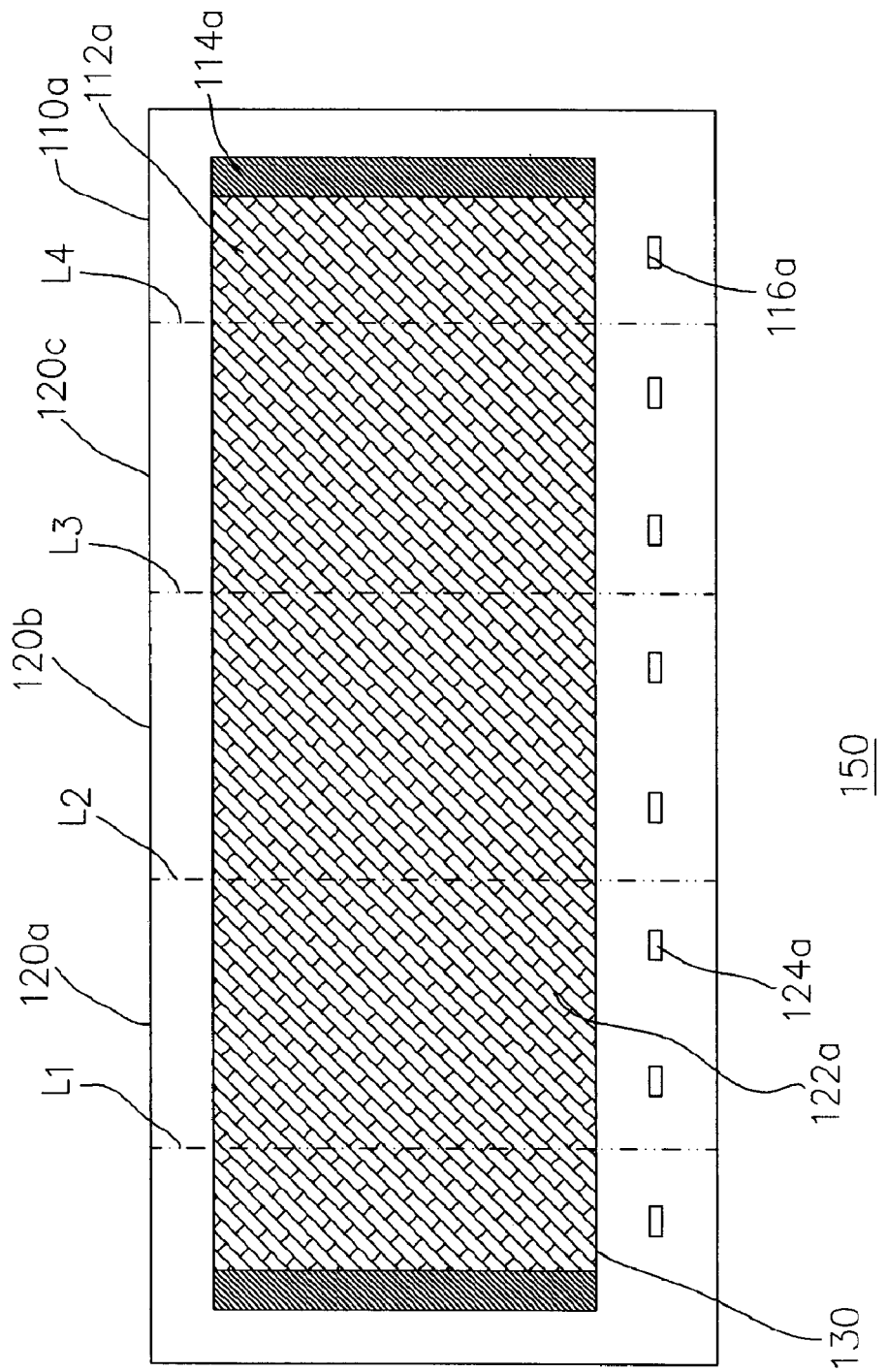
FIG. 2 is a schematic drawing illustrating a conventional thin film transistor array substrate.
Figure 5:
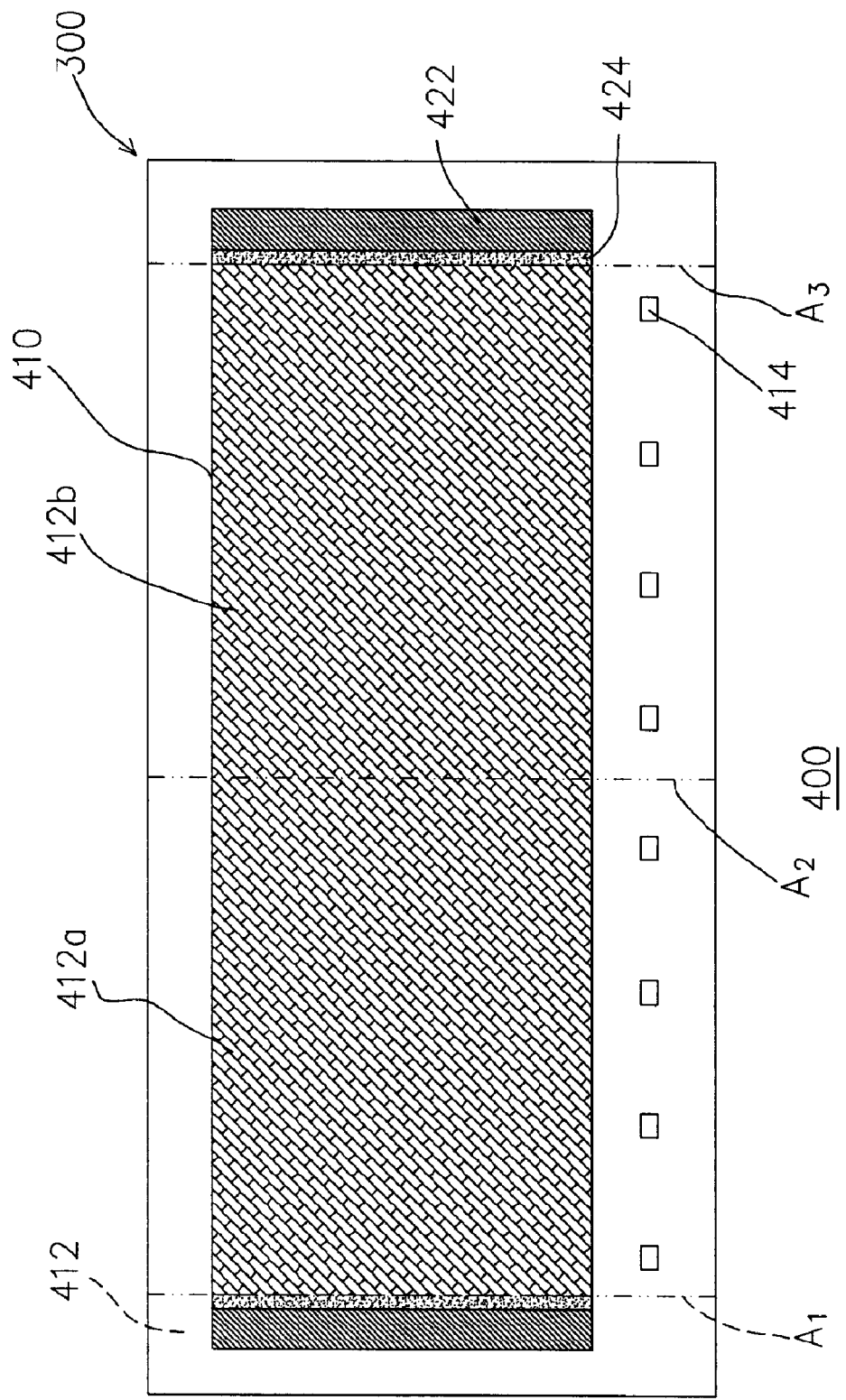
FIG. 5 is a schematic drawing illustrating a flat panel of the thin film transistor array substrate.

FIG. 5 is a schematic drawing illustrating a flat panel of the thin film transistor array substrate. As shown in FIG. 5, the thin film transistor array substrate 400 includes, for example, but not limited to, a substrate 300, a first pixel structure 412a, a second pixel structure 412b, driving element bonding areas 414, peripheral circuits 422 and stitching pixel structures 424. The first pixel structure 412a and the second pixel structure 412b are connected along the junction line A2, and a panel-display area 410 (the area surrounded by the dotted line in FIG. 2) of the thin film transistor array substrate 400 of the present invention is constructed. Moreover, the stitching pixel structures 424 are connected with the first pixel structure 412a and the second pixel structure 412b along the junction line A1 and A3 in the non-panel-display area 412 respectively. Therefore, the trace in the panel-display area 410 generated by the alignment errors during the connection of the first pixel structure 412a and the second pixel structure 412b with the stitching pixel structure 424 can be avoided.

Accordingly, when the design of the mask the thin film transistor array substrate of the present invention is provided for forming the thin film transistor array substrate of the present invention. The mask of the present invention used for forming the thin film transistor array substrate of the present invention is provided with connecting the stitching pixel patterns in the non-display element area with the pixel patterns in the display element area. Therefore, the connection area of the conventional pixel pattern is shifted to a portion outside the display area of the thin film transistor array substrate, in order to reduce the generation of the trace during the connection of the exposure process. Moreover, in the design of the mask of the present invention, the non-display element area only includes the peripheral circuit patterns and the stitching pixel structure used for the connection of the exposure process. Therefore, the area occupied by of the non-display element area in the whole mask can be reduced, and the area occupied by the display element area in the whole mask can be increased relatively. Thus, when the exposure process of the thin film transistor array substrate of the present invention is provided, it is advantageous that less exposure time for each exposure is required to achieve the same display element area of a thin film transistor array substrate in compared to that of a prior art. Thus, the throughput of the exposure process is enhanced.

It is noted that, in the above embodiment of the present invention, the exposure process of the thin film transistor array substrate is accomplished by a one step process in the whole process of manufacturing a thin film transistor array substrate. Substantially, the whole process of manufacturing the thin film transistor array substrate of the present invention includes a plurality of exposure processes by using a plurality of masks, and a plurality of development and etching processes. Moreover, the exposure process of the present invention is not only limited in the manufacturing of a thin film transistor array substrate, but also can be provided for the manufacturing process of a variety of semiconductor or microelectromechanical systems (MES) components incorporated with an improved design of mask.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A mask for a thin film transistor (TFT) array substrate, wherein the mask has a display element area and a non-display element area, the mask comprising:

a plurality of pixel patterns disposed in the display element area;

a plurality of peripheral circuit patterns disposed in the non-display element area; and a plurality of stitching pixel patterns disposed in a portion of the non-display element area adjacent to the display element area.

2. The mask of claim 1, further comprising a plurality of driving element bonding patterns disposed at an edge of the display element area.

3. The mask of claim 1, wherein the non-display element area is disposed at two edges of the display element area.

4. A thin film transistor (TFT) array substrate having a non-panel-display area and a panel-display area, comprising:

a plurality of pixel structures, disposed in a panel-display component;

a plurality of peripheral circuits, disposed in the non-panel-display area; and a plurality of stitching pixel structures, disposed in the non-panel-display area, wherein the stitching pixel structures and the pixel structures are connected in the non-panel-display area.

5. The thin film transistor (TFT) array substrate of claim 4, further comprising a plurality of driving element bonding areas disposed at an edge of the panel-display area.

6. The thin film transistor (TFT) array substrate of claim 4, wherein the non-display element area is disposed at two edges of the display element area.

7. A thin film transistor (TFT) array substrate having a non-panel-display area and a panel-display area comprising:

a plurality of pixel structures, disposed in a panel-display component;

a plurity of first stitching pixel structures, disposed in the panel-display component, wherein the stitching pixel structures are adjacent to the pixel structures;

a plurality of peripheral circuits, disposed in the non-panel-display area; and a plurality of second stitching pixel strictures, disposed in the non-panel-display area, wherein the first stitching pixel structures of the panel-display component and the second stitching pixel structures of the non-panel-display area are connected in the non-panel-display area.

* * * * *